United States Patent
Clauss

(10) Patent No.: US 8,163,667 B2
(45) Date of Patent: Apr. 24, 2012

(54) TRANSMITTING OPTICAL ELEMENT WITH LOW FOREIGN-ELEMENT CONTAMINATION

(75) Inventor: Wilfried Clauss, Tuebingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 218 days.

(21) Appl. No.: 12/488,059

(22) Filed: Jun. 19, 2009

(65) Prior Publication Data
US 2009/0251673 A1  Oct. 8, 2009

Related U.S. Application Data

(63) Continuation of application No. PCT/EP2007/011229, filed on Dec. 20, 2007.

(60) Provisional application No. 60/871,350, filed on Dec. 21, 2006.

(30) Foreign Application Priority Data

Dec. 21, 2006  (DE) .......................... 10 2006 061 848

(51) Int. Cl.
C04B 35/04 (2006.01)
C04B 35/03 (2006.01)
C04B 35/50 (2006.01)
C04B 35/51 (2006.01)

(52) U.S. Cl. .................... 501/120; 501/119; 501/152

(58) Field of Classification Search .............. 501/118, 501/119, 120, 127, 152, 153, 10; 264/1.21, 264/1.22

See application file for complete search history.

(56) References Cited

U.S. PATENT DOCUMENTS

| | | | |
|---|---|---|---|
| 4,543,346 A | 9/1985 | Matsui et al. | |
| 4,930,731 A | 6/1990 | Roy et al. | |
| 5,021,302 A | 6/1991 | Brandle, Jr. et al. | |
| 5,096,862 A * | 3/1992 | Mathers et al. | 501/96.1 |
| 5,244,849 A | 9/1993 | Roy et al. | |
| 5,492,871 A | 2/1996 | van Zyl et al. | |
| 5,536,244 A | 7/1996 | Muller et al. | |
| 6,406,769 B1 | 6/2002 | Delabre | |
| 7,247,589 B2 | 7/2007 | Krell et al. | |
| 2005/0215419 A1 | 9/2005 | Takagimi et al. | |
| 2006/0066962 A1* | 3/2006 | Totzeck et al. | 359/819 |
| 2006/0217260 A1* | 9/2006 | Villalobos et al. | 501/120 |
| 2009/0201478 A1 | 8/2009 | Clauss et al. | |

FOREIGN PATENT DOCUMENTS

CN            1 127 734 A      7/1996
(Continued)

OTHER PUBLICATIONS

Sluiter, M. et al.: "Intermixing tendencies in Garnets: Pyrope and Grossular.", Physical Review B, vol. 70, 2004, pp. 184120-1-184120-4.

(Continued)

Primary Examiner — Jerry Lorengo
Assistant Examiner — Noah Wiese
(74) Attorney, Agent, or Firm — Sughrue Mion, PLLC

(57) ABSTRACT

A transmitting optical element of polycrystalline material that includes crystallites of magnesium spinel $MgAl_2O_4$ or lutetium-aluminum garnet $Lu_3Al_5O_{12}$, wherein the polycrystalline material includes an average total concentration of foreign element contamination caused by Y, Sc, Co, Ni, Zr, Mo, Sn and/or Nb of less than 50 ppm, preferably of less than 20 ppm, and more preferably of less than 15 ppm.

30 Claims, 1 Drawing Sheet

FOREIGN PATENT DOCUMENTS

| | | |
|---|---|---|
| EP | 0 332 393 A | 9/1989 |
| EP | 0 926 106 A1 | 6/1999 |
| GB | 2 031 399 A | 4/1980 |
| JP | 6-107456 A | 4/1994 |
| WO | 88/08829 A2 | 11/1988 |
| WO | 2006 061225 A | 6/2006 |
| WO | 2006/066816 A1 | 6/2006 |
| WO | 2006/104540 A2 | 10/2006 |

OTHER PUBLICATIONS

Burnett, J. et al.: "High-index optical materials for 193 nm immersion lithography" Proc. of Spie, vol. 6154, 2006, pp. 615418-1-615418-12.

J. Burnett et al., "High-Index Materials for 193 nm Immersion Lithography," NIST Atomic Phys Div: DUV High Index Materials, Jul. 2005.

J. Burnett et al., "High-Index Materials for 193 nm Immersion Lithography," Proceedings of SPIE vol. 5754, Bellingham, WA, 2005, pp. 611-612. Conference: Optical Microlithography XVIII, San Jose, VA; Conference Date: Mar. 1, 2005; Publication Date: May 2005.

J. Burnett et al., "High-Index Materials for 193 nm Immersion Lithography," International SEMATECH Immersion Technology Advisory Group Meeting, Jan. 26, 2005.

Chang, X. et al., "$MgAl_2O_4$ Transparent Nano-Ceramics Prepared by Sintering under Ultrahigh Pressure," Key Engineering Materials, vols. 280-283, Trans Tech Publications, Switzerland, 2005, pp. 549-552.

Huang C. et al., "Properties and Microstructure of Optically Transparent Polycrystalline Spinel," Key Engineering Materials, vols. 280-283, Trans Tech Publications, Switzerland, 2005, pp. 545-548.

West G. D., et al., "Transparent Fine-grained Oxide Ceramics," Key Engineering Materials, vols. 264-268, Trans Tech Publications, Switzerland, 2004, pp. 801-804.

Woosley, J.D. et al., "Photoelectric Effects in Magnesium Aluminum Spinel", Phys. Rev. B, vol. 22, No. 2, 1980, pp. 1065-1072.

Roblin, G., "Problemes poses par la conception d'un objectif photoreducteur fonctionnant en UV" [Problems posed by the design of a photoreducing objective operating in the UV] from J. Optics (Paris), 1984, vol. 15, No. 4 pp. 281-285.

Apetz, R. et al., "Transparent Alumina: A Ligh-Scattering Model," J. Am. Ceram. Soc., 86(3) 2003, pp. 480-486.

Maekawa, H. et al.: "Cation mixing in natural $MgAl_2O_4$ spinel: A high-temperature Al NMR study"; American Mineralogist, vol. 82, 1997, pp. 1125-1132.

Mo, S. et al.: "Electronic structure of normal, inverse, and partially inverse spinels in the $MgAl_2O_4$ system"; The American Phsyical Society, vol. 54, No. 23, 1996, pp. 16,555-16,561.

Shimada M, et al.: "Fabrication of transparent spinel polycrystalline materials"; Elsevier Science B.V., Materials Letters, Oct. 1996, pp. 413-415.

Tsukuma, K., et al., "Transparent $MgAl_2O_4$ Spinel Ceramics Produced by HIP Post-Sintering"; Journal of Ceramic Society of Japan, vol. 441, No. 10, 2006, pp. 802-806.

Tanaka I., et al.: "Identification of ultradilute dopants in ceramics"; Nature Materials, Advanced Online Publishing, Jul. 13, 2003, Nature Publishing Group, pp. 1-5.

Dericioglu, A. F., et al.: "Effect of grain boundary microcracking on the light transmittance of sintered transparent MgAl204." Journal of the European Ceramic Society, Elsevier Science Publishers, Barking, Essex, GB, vol. 23, No. 6, May 2003 pp. 951-959.

Liao Y., et. al.: "Transparent lutetium aluminum garnet sintered from carbonate coprecipitated powders" Elsevier Science B.V., Material Letters, vol. 59, No. 28, Dec. 2005, pp. 3724-3727.

J. Burnett et al., "High-Index Materials for 193 nm and 157 Immersion Lithography," International Symposium on Immersion & 157 nm Lithography, Vancouver, Feb. 8, 2004.

J. Burnett et al., "High-Index Materials for 193 nm and 157 Immersion Lithography," SPIE Microlithography 30, San Jose, VA, Mar. 3, 2005.

J. Burnett et al., "High-Index Materials for 193 nm Immersion Lithography," 2nd International Symposium on Immersion Lithography, Bruges, Belgium, Sep. 15, 2005.

\* cited by examiner

Fig.
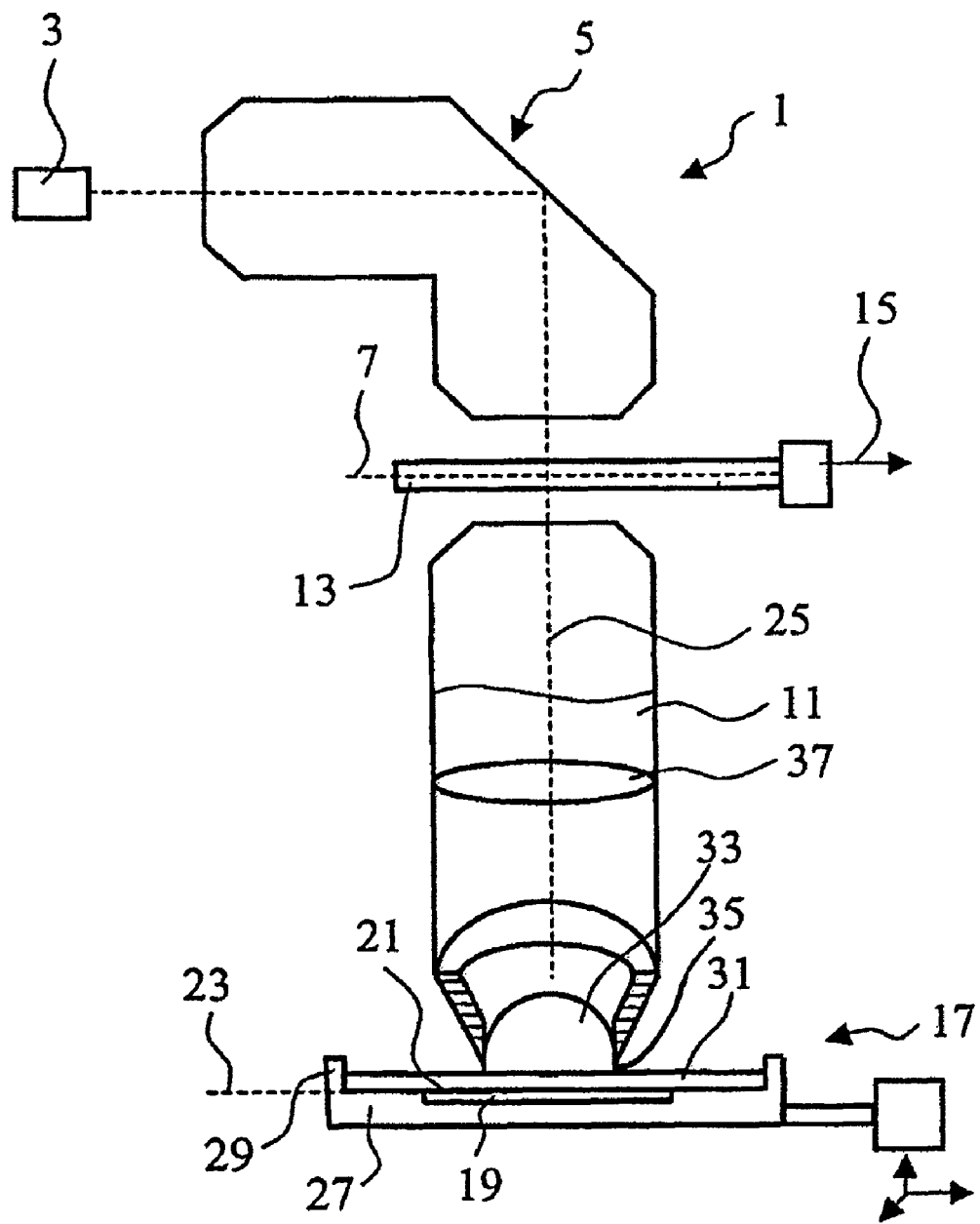

TRANSMITTING OPTICAL ELEMENT WITH LOW FOREIGN-ELEMENT CONTAMINATION

CROSS-REFERENCE TO RELATED APPLICATIONS

This is a Continuation of International Application PCT/EP2007/011229, with an international filing date of Dec. 20, 2007, which was published under PCT Article 21(2) in English, and the complete disclosure of which is incorporated into this application by reference. This application claims the benefit under 35 U.S.C. 119(e)(1) of U.S. Provisional Application No. 60/871,350, filed Dec. 21, 2006. The disclosure of U.S. Provisional Application No. 60/871,350 filed Dec. 21, 2006 is incorporated by reference in the disclosure of this application. This application further claims priority under 35 U.S.C. 119(a) to German Patent Application No. 10 2006 061 848.3 filed on Dec. 21, 2006, the disclosure of which is hereby incorporated by reference in the disclosure of this application.

FIELD OF AND BACKGROUND TO THE INVENTION

The invention relates to a transmitting optical element that can be used in a projection exposure apparatus for microlithography. Furthermore, the invention relates to a projection exposure apparatus for microlithography.

Projection exposure apparatus for microlithography are used in the production of semiconductor components and other finely-structured components. Apart from a light source and an illumination system for illuminating a photo mask or reticle, such a projection exposure apparatus includes a projection lens that projects the pattern of the reticle onto a light-sensitive substrate, for example a silicon wafer coated with a photo resist.

In order to produce ever smaller structures in the order of magnitude of less than 100 nm, up to now predominantly three approaches have been pursued. Firstly, attempts have been made to continue to enlarge the numerical aperture NA, on the image side, of the projection lenses. Secondly, the wavelength of the illumination light is continually being reduced, preferably to UV wavelength, in particular to wavelengths below 250 nm, for example 248 nm or 193 nm. Thirdly, further measures to improve the resolution are used, for example phase-shifting masks, multipolar illumination or oblique illumination.

Immersion lithography represents another approach to increasing the resolution. In this technique an immersion fluid is placed in the gap that remains between the last optical element on the image side, in particular a lens, of the projection lens and the photo resist or some other light-sensitive coating to be exposed. Projection lenses that are designed for immersion operation are also referred to as immersion lenses.

The advantages of immersion lithography are due to the fact that, as a result of the higher refractive index of the immersion fluid when compared to the vacuum, the exposure wavelength is reduced to an effective exposure wavelength. This is accompanied by an increase in the resolution and the focal depth.

The use of immersion fluids with a high refractive index makes it possible to achieve significant increases in the angle of incidence into the resist when compared to systems without immersion. However, in order to utilize the advantage of highly refractive immersion fluids to the maximum, it is necessary for the last optical element of the projection lens, which element is in contact with the immersion fluid, to also have a high refractive index.

In the case of UV wavelengths, in particular wavelengths below 250 nm, either silica glass or monocrystalline materials, for example calcium fluoride ($CaF_2$), are used as materials for optical elements in a lens of a projection exposure apparatus for microlithography. At a wavelength of 193 nm, the refractive index of silica glass is 1.5603.

In monocrystalline materials with a cubic crystal structure, for example $CaF_2$, the effect of intrinsic birefringence is noticeable in this wavelength range, and even more so in shorter operating wavelengths such as 157 nm. The dependence of the refractive index on the polarization state of the incident light, which dependence is caused by the intrinsic birefringence, limits the image quality of the projection lenses produced with these materials. For this reason, elaborate compensation measures are necessary, for example special lens designs with combinations of various birefringent lens materials or crystal orientation is required in order to ensure sufficient imaging quality of such projection lenses.

In John H. Burnett et al., "High Index Materials for 193 nm and 157 nm Immersion Lithography", International Symposium on Immersion & 157 nm Lithography, Vancouver, Feb. 8, 2004, materials for application in a projection lens for microlithography, in particular in an immersion lens, are stated, among them alkaline earth metal oxide monocrystals such as MgO, CaO, SrO or BaO, as well as mixed crystals such as $MgAl_2O_4$ or $Mg_xCa_{1-x}O$. However, already at 193 nm, all these materials show significant intrinsic birefringence. Thus there are problems that are very similar to those experienced with the use of $CaF_2$.

WO 2006/061225 A1 therefore proposed the use of optical elements made of highly refractive polycrystalline material, for example polycrystalline spinel, such as magnesium spinel $MgAl_2O_4$, or polycrystalline garnet, such as yttrium-aluminum-garnet $Y_3Al_5O_{12}$ or lutetium-aluminum garnet $Lu_3Al_5O_{12}$, in a projection exposure apparatus for microlithography. Due to the statistical alignment of the crystal axes of the individual crystalline units, also referred to as crystallites, in a polycrystalline solid body the average value of the intrinsic birefringence in all spatial directions approaches zero. There is thus no need to provide complicated devices for compensating for the intrinsic birefringence. Magnesium spinel and the garnets stated in WO 2006/061225 A1 have high refractive indices of more than 1.8 at a wavelength of 193 nm, and are therefore particularly suited to immersion lithography.

From the literature, a band gap of 9 eV for magnesium spinel is known, for example from the article by J. D. Woosley, C. Wood, E. Sonder, and R. A. Weeks, "Photoelectric Effects in Magnesium Aluminum Spinel", Phys. Rev. B, vol. 22, page 1065 (1980). This equates to a theoretical absorption edge of approximately 140 nm. However, more recent measurements have shown that the band gap of magnesium spinel is in fact somewhat smaller, namely only 7.8 eV. Accordingly, the absorption edge is around 160 nm. In the case of $Lu_3Al_5O_{12}$ the band gap is even as low as 6.8 eV, which corresponds to an absorption edge of around 180 nm. When these materials are used in a projection exposure apparatus for microlithography with an operating wavelength of 193 nm, this operating wavelength is thus already very close to the absorption edge. Even a slight shift in the absorption edge towards higher energies can thus cause a significant deterioration of the transmission at this wavelength.

OBJECT AND SUMMARY OF THE INVENTION

It is thus one object of the invention to provide a transmitting optical element with a high refractive index, which element provides good transmission at an operating wavelength close to the absorption edge, in particular at 193 nm.

Experimental investigations have shown that an optical element made of a polycrystalline material that contains crystallites of magnesium spinel $MgAl_2O_4$ or lutetium-aluminum garnet $Lu_3Al_5O_{12}$ provides adequate transmission to electromagnetic radiation of 193 nm, when the average total concentration of foreign-element contamination caused by yttrium (Y), scandium (Sc), cobalt (Co), nickel (Ni), zirconium (Zr), molybdenum (Mo), tin (Sn), and niobium (Nb), i.e. the concentration of the sum of the weights of all foreign atoms of these elements relating to the overall weight of crystal atoms, is less than 50 ppm, preferably less than 20 ppm, and more preferably less than 15 ppm.

A polycrystalline material includes individual crystalline units whose crystal axes are, as a rule, statistically aligned in space. These crystalline units are referred to as crystallites. Polycrystalline metal oxides are also referred to as ceramics, and correspondingly the designation magnesium spinel ceramics or lutetium-aluminum garnet ceramics is equivalent to the designation polycrystalline magnesium spinel or polycrystalline lutetium-aluminum garnet.

Throughout this document, the term foreign-element contamination refers to contamination by atoms or ions of an element that does not occur in the chemical formula of the respective polycrystalline material, thus $MgAl_2O_4$ or $Lu_3Al_5O_{12}$. The concentration of foreign-element contamination is stated in units of ppm (parts per million (by weight)), i.e. the weight of the particles, e.g. atoms or ions, of the foreign-element contamination relative to the overall weight of all atoms or ions contained in the material. The average concentration is obtained in that a chemical analysis of a sample is made, which analysis includes material from various spatial regions of a polycrystalline optical element or a lens blank. The average concentration is obtained by forming the arithmetic average.

In particular, contamination involving some side group metals, alkali metals, halogens, and some elements of the first and second period of the periodic system of the elements, among them in particular the above-mentioned Y, Sc, Co, Ni, Zr, Mo, Sn, and Nb, as well as vanadium (V), copper (Cu), zinc (Zn), manganese (Mn), iron (Fe), chromium (Cr), titanium (Ti), potassium (K), sodium (Na), boron (B), carbon (C), chlorine (Cl), sulphur (S), silicon (Si), and lead (Pb), is critical foreign-element contamination as far as the transmission of polycrystalline $MgAl_2O_4$ or $Lu_3Al_5O_{12}$ is concerned.

As a rule, foreign-element contamination caused by the other elements in the above-mentioned groups occurs either not at all or only in very small concentrations in the source materials in the production of magnesium spinel or lutetium-aluminum garnet. These elements are therefore less important in the production of an optical element, or in the selection of a suitable optical material for an optical element. Ideally, none of these remaining elements should exceed a concentration of 5 ppm. Overall, the concentration of the entire foreign-element contamination in the optical material should not exceed a value of 100 ppm.

Experiments involving targeted doping of the polycrystalline material with critical contamination have shown that in particular the elements V, Co, Ni, Cu, Zn, Zr, Nb, Mo, Mn, Fe, Cr, Ga, Pb, Sn, and Ti significantly reduce transmission at 193 nm. It is thus advantageous if the average concentration of any individual one of these elements is less than 3 ppm. Preferably, the average concentration of any individual one of these elements is less than 1 ppm.

Experiments have also shown that alkali metals, in particular K and Na, are also to be regarded as critical contamination, because together with the aluminum components of $MgAl_2O_4$ or $Lu_3Al_5O_{12}$ they form precipitation of β aluminum oxide. This also results in a significant reduction in transmission. It is thus advantageous if the average overall concentration of K and/or Na is less than 15 ppm. Other frequently encountered contamination such as B, C, Cl, and S, when incorporated in the spinel lattice, leads to color centers as a result of the disturbance of the lattice that occurs. Preferably, the average concentration of any individual one of the elements K, Na, B, C, Cl, and S is less than 10 ppm.

Surprisingly, doping experiments have also shown that contamination of Y, Sc, and Si apparently has a lesser effect on the transmission of an optical element made of polycrystalline $MgAl_2O_4$ or $Lu_3Al_5O_{12}$. It is thus sufficient for the concentration of any individual one of the elements Y, Sc, and Si to be less than 6 ppm. In particular, it may be sufficient if the concentration of any individual one of the elements Y and Sc is less than 6 ppm, preferably less than 3 ppm.

It is known that the absorption caused by transition metals or their ions, respectively, is dependent upon their respective oxidation state. For example, the Fe3+ state has its absorption maxima at 260 nm and 193 nm, the latter absorption maximum naturally being particularly detrimental for use at a wavelength of 193 nm. The oxidation state of Fe or other multivalent foreign elements (Cr, Mn etc.) in the transmitting optical element may be controlled by influencing the process conditions of the high-temperature process (annealing) steps following a sintering step for producing a ceramic body from the polycrystalline source material. Namely, the reduction of Fe from the Fe3+ state to the Fe2+ state may be performed by a treatment of the ceramic body in a reductive gas atmosphere. In such a way, it is expected to reduce the concentration of Fe in the Fe3+ state from originally about 100% by at least one half, such that in the resulting transmitting optical element, the concentration of Fe in the oxidation state Fe2+ is higher than the concentration of Fe in the oxidation state Fe3+.

In order to keep not only dispersion loss but also birefringence effects low, it is advantageous to select the average crystallite size of the polycrystalline material so that it is between 0.5 and 100 μm. Preferred is an average crystallite size between 5 and 100 μm, particularly preferred between 5 and 50 μm. The average crystallite size is determined by means of the root mean square, rms.

Besides foreign-element contamination, in magnesium spinel the transmission can also be impaired in that aluminum ions occupy lattice locations at which magnesium ions are located in an ideal crystal. This can occur when the ratio between aluminum- and magnesium concentration in the crystal lattice does not exactly correspond to the concentration ratio, predetermined by stoichiometry, of magnesium to aluminum of 1:2. It has been shown that good transmission for light of a wavelength of 193 nm is ensured up to a deviation of 4% from the concentration ratio predetermined by stoichiometry. A deviation of less than 2% is preferred.

Moreover, the arrangement of aluminum ions on a magnesium lattice location can occur when the spinel material includes inverse fractions. In the spinel crystal lattice the $O^{2-}$ ions form a cubic, face-centered crystal lattice, an eighth of whose tetrahedral gaps is occupied by $Mg^{2+}$ ions, and half of whose octahedral gaps is occupied by $Al^{3+}$ ions. In the inverse spinel lattice the stoichiometry is the same, except that the $Mg^{2+}$ ions occupy octahedral gaps while half of the $Al^{3+}$ ions occupy octahedral gaps with the other half occupying tetrahedral gaps. An $MgAl_2O_4$ crystal or -crystallite can also essentially have a spinel structure that includes a certain inverse fraction. This inverse fraction corresponds to the fraction x in the general notation of the magnesium spinel expression $(Mg_{1-x}Al_x)[Mg_xAl_{2-x}]O_4$, wherein x=0 denotes a normal spinel structure, while x=1 denotes an inverse spinel structure. It has been shown that a still greater increase in transmission at 193 nm can be achieved in that the content of inversion defects is preferably no larger than 40%, preferably no larger than 10% of the Mg lattice locations, which corresponds to a value x of 0.1.

Such a transmitting element has an absorption coefficient $k<0.01$ cm$^{-1}$, preferably $k<0.005$ cm$^{-1}$, for light of a wavelength of 193 nm.

The absorption coefficient is defined as $k=-\log 10(T/d)$, where T is the measured transmission, corrected for the surface reflection (Fresnel loss), and d is the thickness of the sample in units of cm. Transmission measurement is done in a spectrometer with an opening aperture angle of less than 2°. Note that in this definition, a correction for scatter contribution in the measured extinction is neglected. For high-quality samples with low scattering, this assumption is reasonable. An element with such a transmission is suitable for use in a projection exposure apparatus for microlithography, in particular at operating wavelengths in the UV range of less than 250 nm, preferably 248 nm, particularly preferably 193 nm.

A projection exposure apparatus has an illumination system for illuminating a reticle, as well as a projection lens for imaging a reticle structure on a light-sensitive substrate. Both in the illumination system and in the projection lens such a transmitting optical element can be used to advantage.

In a preferred embodiment the transmitting optical element is the last element, on the image side, of the projection lens. If the projection exposure apparatus is used in immersion operation, the gap that forms between the last element, on the image side, of the projection lens, i.e. the transmitting optical element according to the invention and the light-sensitive substrate, is at least partly filled with an immersion fluid. With the use of such a highly transparent polycrystalline optical element including $MgAl_2O_4$ or $Lu_3Al_5O_{12}$, in particular in combination with a highly refractive immersion fluid, the numerical aperture of the projection lens can be more than 1.2, in particular more than 1.35, or even more than 1.5.

In order to produce a polycrystalline material that has crystallites of magnesium spinel $MgAl_2O_4$ or lutetium-aluminum garnet $Lu_3Al_5O_{12}$, wherein the polycrystalline material further has foreign-element contamination caused by at least one multivalent element with at least two oxidation states, in particular Fe, Cr, or Mn, a method is provided which includes: sintering the polycrystalline material to form a ceramic body, and transforming at least part of the at least one multivalent element from a first oxidation state to a second, lower oxidation state by exposing the ceramic body to a reductive gas atmosphere at a temperature at or above 900° C., preferably between 900° C. and 1400° C.

The method may be advantageously used to reduce the absorption caused by multivalent elements whenever the first oxidation state having a higher oxidation number (e.g. Fe3+) is more absorptive than the second oxidation state (e.g. Fe2+) having a lower oxidation number. The above method is particularly advantageous in case that foreign-element contamination caused by Fe is present in the polycrystalline material, as Fe is usually present in the Fe3+ state after the sintering process, the Fe3+ state having an absorption maximum at a wavelength of 193 nm, whereas the Fe2+ state has not. Of course, the above method may also be used to transform the oxidation states of other elements such as Cr, Mn, etc. in order to reduce the concentration of the multivalent element in the higher oxidation state and to increase the concentration of that element in the lower oxidation state. With the above method, it is expected that the concentration of the foreign element in the higher oxidation state may be reduced by at least 50%, possibly even 70% or more.

Preferably, the reductive gas atmosphere includes hydrogen as a reductive gas, which may be used as a mixture with noble gases or nitrogen for safety reasons. The amount of hydrogen in the reductive gas atmosphere is usually between 5% and 20%. In a highly preferred variant, the reductive gas atmosphere comprises oxygen gas at a partial pressure of at least 1 ppm, preferably of at least 5 ppm. A small amount of oxygen gas in the reductive gas atmosphere can be used to at least partially prevent diffusion of oxygen out of the ceramic body and thus help to avoid an increase of the number of oxygen vacancies in the ceramic body. The oxygen content of the gas atmosphere should not exceed 20 ppm in order to prevent formation of oxyhydrogen gas.

Further characteristics and advantages of the invention are set out in the following description of exemplary embodiments of the invention, in the figures of the drawing that show details that are significant in the context of the invention, and in the claims. Individual characteristics can be implemented individually per se or several together in any combination in variants encompassed by the invention.

BRIEF DESCRIPTION OF THE DRAWINGS

The invention is explained in further detail with reference to the drawing.

The sole FIGURE shows a diagrammatic view of a projection exposure apparatus for immersion lithography, with a projection lens that includes transmitting optical elements made of polycrystalline spinel.

DETAILED DESCRIPTION OF PREFERRED EMBODIMENTS

The FIGURE diagrammatically shows a microlithography projection exposure apparatus 1 that is configured for the production of highly-integrated semiconductor components using immersion lithography. An excimer laser 3 with an operating wavelength of 193 nm constitutes the light source of the projection exposure apparatus 1. As an alternative, light sources with other operating wavelengths are also feasible, for example 248 nm or 157 nm. An illumination system 5 arranged downstream of the laser 3 is arranged to produce a large, clearly defined illumination field in its exit plane or object plane 7, such that the illumination field is illuminated very homogeneously and matches the telecentric requirements of the projection lens 11 arranged downstream. The illumination system 5 includes devices for controlling aperture illumination and for setting a predetermined polarization state of the illumination light.

In the beam path behind the illumination system a device (reticle stage) for holding and moving a mask 13 is arranged such that the latter is positioned in the lens plane 7 of the projection lens 11 and in this plane, for scanning operation, is movable in a travel direction 15.

Behind the object plane 7, also referred to as the mask plane, the projection lens 11 follows, which images an image of the mask at reduced scale onto a substrate 19 having a photo resist 21, for example a silicon wafer. The substrate 19 is arranged such that the plane substrate surface with the photo resist 21 essentially coincides with the image plane 23 of the projection lens 11. The substrate is held by a device 17 configured with a drive in order to move the substrate 19 synchronously with the mask 13. The device 17 also includes manipulators in order to move the substrate 19 both in the z-direction parallel to the optical axis 25 of the projection lens 11, and in the x- and y directions perpendicularly to this axis. A tilt device having at least one tilt axis that extends perpendicularly in relation to the optical axis 25 is integrated.

The device 17 (wafer stage) provided for holding the substrate 19 is designed for use in immersion lithography. The device 17 includes an accommodation device 27, which can be moved by a scanner drive, with the bottom of the accommodation device 27 fashioned with a shallow recess for accommodating the substrate 19. A circumferential rim 29 defines a flat, open-top, container for an immersion fluid 31. The height of the rim is designed such that the filled-in immersion fluid 31 completely covers the substrate surface with the photo resist 21, and the emergence-side end region of the projection lens 11 dips into the immersion fluid when the operating distance between the emergence-side of the lens and the substrate surface is correctly set.

The projection lens 11 has a numerical aperture NA on the image side of at least NA=1.2, preferably of more than 1.35, and most preferably of more than 1.5, and is thus particularly matched to the use of immersion fluids having a high refractive index.

The last optical element of the projection lens 11, which optical element is closest to the image plane 23, is or includes a hemispheric plano-convex lens 33, whose exit surface 35 is the last optical surface of the projection lens 11. When the projection exposure apparatus is operating, the exit surface of the last optical element is completely immersed in the immersion fluid 31 and is wetted by it. The hemispherical plano-convex lens 33, as well as the further lens 37, consists of polycrystalline magnesium spinel. As an alternative, at least one of these lenses could also consist of polycrystalline garnet, in particular lutetium-aluminum garnet.

Optionally, the plano-convex lens 33 and the further lens 37 are provided with an antireflective coating. This antireflective coating includes an alternating sequence of materials with low refraction and materials with high refraction. In particular in the case of an operating wavelength of the projection exposure apparatus 1 of 193 nm, the following materials with low refraction are suitable: $MgF_2$, $AlF_3$, $Na_5Al_3F_{14}$, $Na_3AlF_6$, $SiO2$, $LiF$ and $NaF$, while the following are suitable as highly refractive materials: $LaF_3$, $GdF_3$, $NdF_3$, $Al_2O_3$ and $DyF_3$.

The lenses 33 and 37 consist of polycrystalline magnesium spinel, or, as an alternative, lutetium-aluminum garnet, of high purity, in order to ensure adequate transmission. Lithography applications require an absorption coefficient of k<0.01/cm, or in particular even 0.005/cm, at an operating wavelength of >193 nm.

It has been shown that foreign-element contamination can be classified into various groups depending on the type of effect the contamination has on the absorption of the $MgAl_2O_4$.

A first group includes various transition metals that have excitation levels in the region of the operating wavelength of 193 nm. As an example, Table 1 lists such excitation levels for Cr, Fe and Mn and other materials, as described e.g. in Izumi et al., PRB 76, 075111 (2007). In this region Fe has two strongly absorbing excitation levels. Accordingly, these elements absorb a fraction of the impinging light and in this way lead to undesirable absorption.

Experiments in which $MgAl_2O_4$ samples that have been doped in a targeted manner with foreign-element contamination up to a concentration of 40 ppm have shown that apart from this first group there are further groups of foreign element contamination that influence the transmission to a different extent. Some exemplary data is shown in Table 2. In this arrangement transmission is stated as a measured transmission T, of a sample of a material doped with particular foreign-element contamination, relative to the transmission of a sample of the same thickness of non-doped material To. The values apply to a wavelength of 200 nm.

It has been shown that the first group of transition metals, in Table 2 represented by Cr and V, cause a very significant reduction in transmission at a wavelength of 200 nm. This is due to the fact that the elements incorporated in the spinel lattice or garnet lattice comprise excitation levels that can be directly activated by UV excitation. Adequate transmission can be achieved if each element of this first group is present at a concentration of less than 2 ppm. If only a few elements of this group are present as contamination, the concentration can be somewhat greater. However, the total concentration of elements of this group should not exceed 20 ppm.

It has been shown that a second group of particular foreign-element impurities in the source material in powder form is less relevant for the production of a transparent polycrystalline solid body. This is, for example, the case with Y. Correspondingly, within the measuring accuracy no influence on the transmission at 200 nm is detectable; compare Table 2. Adequate transmission is achieved if each element of this group is present at a concentration of less than 6 ppm.

A third group includes the alkali metals, in particular Li, Na and K. In the case of temperatures above 1000° C. the aforesaid can form 13-aluminum oxide with the aluminum component of the $MgAl_2O_4$ or of the $Lu_3Al_5O_{12}$ body. This leads to local precipitation in the polycrystalline solid body, which precipitation has a composition according to $XO_2 9Al_2O_3$, wherein X=Li, Na, K. In the case of this third group the transmission loss is not due to direct excitation of atomic excitation levels but instead to the formation of this precipitation. Adequate transmission is achieved if each element of this group is present at a concentration of less than 10 ppm, preferably less than 4 ppm. If only a few elements of this group are present as contamination, then the concentration can be somewhat higher. However, the total concentration should not exceed a value of 15 ppm.

Deviations from the ideal stoichiometry ratio of aluminum to magnesium of 2:1 are a further cause of increased absorption in the region of the absorption edge of magnesium spinel. In order to improve still further the transmission of an optical element of polycrystalline magnesium spinel this ratio can be set already in the source material for the production of a polycrystalline body so that the ratio is essentially 2:1. The deviation from this ratio should then not exceed 0.01.

In the case of spinel, the position of the absorption edge continues to be influenced by the size of the inverse fraction. Apart from moving the absorption edge, the antisite defects that arise as a result of the presence of magnesium ions on foreign lattice locations result in an additional excitation level in the region of 300 nm. In order to still further increase the transmission at 193 nm, the content of inversion defects, i.e. the content of octahedral gaps in the crystal lattice, which defects are occupied by Mg-ions, should not exceed 10% of the Mg lattice locations.

This inverse fraction in the magnesium spinel can be influenced by suitable process control in the production of the polycrystalline body. The influence that temperature has on the crystal structure of magnesium spinel is, for example, described in the article by Maekawa et al. "Cation mixing in natural MgAl2O4 spinel: A high temperature 27Al NMR study", American Mineralogist, Vol. 82, p. 1125-1132, 1997.

In the production of a lens blank made of spinel ceramics or garnet ceramics, generally speaking a source material in powder form, whose purity is sufficient for the abovementioned concentrations of foreign-element contamination to be achieved, is compressed, either dry or in a liquid, at room temperature, to a so-called green compact. A source material, in powder form, with an extremely low content of foreign-element contamination can be obtained by carrying out known cleaning methods several times until the desired purity is obtained.

In a second step the green compact, which still has comparatively large pores and even channels, is sintered at temperatures up to 1400° C. or even 1700° C., e.g. under vacuum conditions or in an air/protective gas environment, depending upon the type of the source material being used. This process step leads to further compression of the body so that there are no longer any channels, and the remaining isolated pores are smaller in size than was the case prior to sintering.

In a third step the remaining pores are further reduced in size by hot isostatic pressing (HIP). Just like sintering, hot isostatic pressing takes place at temperatures around 1700° C.

Optionally, in case that foreign-element contamination caused by polyvalent elements such as Fe is present in the ceramic body, in a fourth step, the ceramic body is exposed to a reductive gas atmosphere at a temperature at or above 900° C., usually between 900° C. and 1400° C. The reductive gas atmosphere includes an amount of hydrogen gas ranging from 5% to 20%, the hydrogen gas being provided in a mixture with noble gases and/or nitrogen for safety reasons. The reductive gas atmosphere includes oxygen gas at a partial pressure of at least 1 ppm, preferably of at least 5 ppm, but not exceeding 20 ppm. Such a small amount of oxygen gas in the reductive gas atmosphere can be used to at least partially prevent diffusion of oxygen out of the ceramic body and thus helps to prevent an increase of the number of oxygen vacancies in the ceramic body which would otherwise lead to an undesirable augmentation of absorption.

The hydrogen treatment is used for transforming at least part of the multivalent element, which is Fe in the present example, from the oxidation state $Fe^{3+}$ to the oxidation state $Fe^{2+}$. Typically, during such a process about 50% of the Fe in the oxidation state $Fe^{3+}$ can be transformed to the oxidation state $Fe^{2+}$. Supposing that at the beginning of the reductive gas treatment, almost 100% of the Fe in the ceramic body is in the $Fe^{3+}$ state, at the end of the treatment, the concentration of Fe in the oxidation state $Fe^{2+}$ should exceed the concentration of Fe in the oxidation state $Fe^{3+}$. The reduction of the amount of Fe in the $Fe^{3+}$ oxidation state is particularly advantageous, as the $Fe^{3+}$ oxidation state has an absorption maximum at 193 nm.

In a last step the ceramic body is cooled down to room temperature. The smallest possible inverse faction in spinel ceramics can be achieved if the spinel during the sintering process, during hot isostatic pressing, during the hydrogen treatment, and in particular during cooling, is kept in thermodynamic equilibrium.

The exchange processes between Mg and Al occur on a timescale of a few hours. Below 500° C. the equilibrium inversion value is below 10%. The production process is therefore to be carried out in such a way that, during the cooling process, temperature variations occur only at rates <50°/h.

From the polycrystalline magnesium spinel material or lutetium-aluminum garnet material, as a rule a lens blank is produced that is either cylindrically symmetric or that already approximates the final geometry, from which lens blank a transmitting optical element is then produced in a sequence of grinding processes and polishing processes.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

TABLE 1

| Element/state | Position of the excitation level (nm) |
| --- | --- |
| Cr ? | 182 |
| Cr 3+ | 244 |
| Fe 3+ | 192, 253 |
| Mn 2+ | 199, 231 |
| Ti 4+ | 280 |
| V 5+ | 274 |
| Co 2+ | 247 |
| Ni 2+ | 210 |

TABLE 2

| Element | Transmission at 193 nm in $T/T_0$ | Transmission at 200 nm in $T/T_0$ |
| --- | --- | --- |
| Non-doped | 1 | 1 |
| Y | 0.4 | 1.07 |
| Cr | 0.02 | 0.32 |
| V | 0.01 | 0.15 |
| K | 0.2 | 0.18 |
| Si | 0.8 | 0.71 |
| Mn | 0.01 | 0.1 |

What is claimed is:

1. A transmitting optical element of polycrystalline material that comprises crystallites of magnesium spinel $MgAl_2O_4$ or lutetium-aluminum garnet $Lu_3Al_5O_{12}$,
    wherein the polycrystalline material comprises an average total concentration of foreign-element contamination of foreign elements Y, Sc, Co, Ni, Zr, Mo, Sn, and Nb of less than 50 ppm and has an absorption coefficient of k<0.01 cm$^{-1}$ for electromagnetic radiation at the wavelength of 193 nm, and
    wherein the polycrystalline material contains at least one of K and Na, and the average total concentration of K and Na is less than 15 ppm.

2. The transmitting optical element according to claim 1, wherein the average concentration of any individual one of the elements V, Co, Ni, Cu, Zn, Zr, Nb, Mo, Mn, Fe, Cr, Ga, Pb, Sn, and Ti is less than 3 ppm.

3. The transmitting optical element according to claim 1, wherein the average concentration of any individual one of the elements K, Na, B, C, Cl and S is less than 10 ppm.

4. The transmitting optical element according to claim 1, wherein the average concentration of the element Si is less than 6 ppm.

5. The transmitting optical element according to claim 1, wherein the concentration of any individual one of the elements Y and Sc is less than 6 ppm.

6. A transmitting optical element of polycrystalline material that comprises crystallites of magnesium spinel $MgAl_2O_4$ or lutetium-aluminum garnet $Lu_3Al_5O_{12}$,
    wherein the polycrystalline material comprises an average total concentration of foreign-element contamination of foreign elements Y, Sc, Co, Ni, Zr, Mo, Sn, and Nb of less than 50 ppm and has an absorption coefficient of k<0.01 cm$^{-1}$ for electromagnetic radiation at the wavelength of 193 nm, and wherein the polycrystalline material contains Fe, and the concentration of Fe in the oxidation state $Fe^{2+}$ is higher than the concentration of Fe in the oxidation state $Fe^{3+}$.

7. The transmitting optical element according to claim 1, wherein an average crystallite size of the crystallites is between 0.5 and 100 μm.

8. The transmitting optical element according to claim 1, wherein the polycrystalline material comprises crystallites of magnesium spinel $MgAl_2O_4$, in which a ratio between the Mg concentration and the Al concentration does not deviate by more than 4% from the concentration ratio, predetermined by stoichiometry, of magnesium to aluminum of 1:2.

9. The transmitting optical element according to claim 8, wherein the ratio between the Mg-concentration and the Al-concentration does not deviate by more than 2% from the concentration ratio, predetermined by stoichiometry, of magnesium to aluminum of 1:2.

10. The transmitting optical element according to claim 1, wherein the polycrystalline material comprises crystallites of magnesium spinel $MgAl_2O_4$, in which crystallites a content of inversion defects is no larger than 40% of the Mg lattice locations.

11. A projection exposure apparatus comprising a lens with an optical element according to claim 1.

12. The projection exposure apparatus according to claim 11, wherein the optical element is one of three last optical elements on an imaging plane side of the lens.

13. A projection exposure apparatus according to claim 11, wherein the optical element is arranged closer to an imaging plane of the lens than any other optical element of the lens.

14. The projection exposure apparatus according to claim 11, wherein the lens is a projection lens that images a structure onto a light-sensitive substrate that is arranged in an imaging plane of the projection lens.

15. The projection exposure apparatus according to claim 14, wherein the optical element is arranged closer to the imaging plane than any other optical element of the lens, and
wherein the projection exposure apparatus further comprises a supply line for providing an immersion fluid in a space between the optical element and the light-sensitive substrate such that the fluid wets the optical element and the light-sensitive substrate at one time.

16. The projection exposure apparatus according to claim 11, wherein the projection exposure apparatus is designed for immersion operation.

17. The projection exposure apparatus according to claim 11, wherein the lens has a numerical aperture of more than 1.2.

18. The projection exposure apparatus according to claim 11, wherein the projection exposure apparatus is designed for operation with electromagnetic radiation in the UV wavelength range.

19. A lens blank of a polycrystalline material that comprises crystallites of magnesium spinel $MgAl_2O_4$ or lutetium-aluminum garnet $Lu_3Al_5O_{12}$,
wherein the polycrystalline material comprises an average total concentration of foreign-element contamination of foreign elements Y, Sc, Co, Ni, Zr, Mo, Sn, and Nb of less than 50 ppm, and has an absorption coefficient of $k<0.01$ $cm^{-1}$ for electromagnetic radiation at the wavelength of 193 nm, and
wherein the polycrystalline material contains at least one of K and Na, and the average total concentration of of K and Na is less than 15 ppm.

20. The lens blank according to claim 19,
wherein the average concentration of any individual one of the elements V, Co, Ni, Cu, Zn, Zr, Nb, Mo, Mn, Fe, Cr, Ga, Pb, Sn, and Ti is less than 3 ppm.

21. The lens blank according to claim 19, wherein the average concentration of any individual one of the elements K, Na, F, B, C, Cl and S is less than 10 ppm.

22. The lens blank according to claim 19, wherein the average concentration the element Si is less than 6 ppm.

23. The lens blank according to claim 19, wherein the concentration of any individual one of the elements Y and Sc is less than 6 ppm.

24. A lens blank of a polycrystalline material that comprises crystallites of magnesium spinel $MgAl_2O_4$ or lutetium-aluminum garnet $Lu_3Al_5O_{12}$,
wherein the polycrystalline material comprises an average total concentration of foreign-element contamination of foreign elements Y, Sc, Co, Ni, Zr, Mo, Sn, and Nb of less than 50 ppm, and has an absorption coefficient of $k<0.01$ $cm^{-1}$ for electromagnetic radiation at the wavelength of 193 nm, and
wherein the polycrystalline material contains Fe, and the concentration of Fe in the oxidation state $Fe^{2+}$ is higher than the concentration of Fe in the oxidation state $Fe^{3+}$.

25. The lens blank according to claim 19, wherein the average crystallite size of the crystallites is between 0.5 and 100 pm.

26. The lens blank according to claim 19, wherein the polycrystalline material comprises crystallites of magnesium spinel $MgAl_2O_4$, in which a ratio between the Mg concentration and the Al concentration does not deviate by more than 4% from the concentration ratio, predetermined by stoichiometry, of magnesium to aluminum of 1:2.

27. The lens blank according to claim 26, wherein the ratio between the Mg concentration and the Al concentration does not deviate by more than 2% from the concentration ratio, predetermined by stoichiometry, of magnesium to aluminum of 1:2.

28. The lens blank according to claim 19, wherein the polycrystalline material comprises crystallites of magnesium spinel $MgAl_2O_4$, in which crystallites a content of inversion defects is no larger than 40% of the Mg lattice locations.

29. The transmitting optical element according to claim 1, wherein the polycrystalline material contains Fe, and the concentration of Fe in the oxidation state $Fe^{2+}$ is higher than the concentration of Fe in the oxidation state $Fe^{3+}$.

30. The lens blank according to claim 19, wherein the polycrystalline material contains Fe, and the concentration of Fe in the oxidation state $Fe^{2+}$ is higher than the concentration of Fe in the oxidation state $Fe^{3+}$.

* * * * *

UNITED STATES PATENT AND TRADEMARK OFFICE
CERTIFICATE OF CORRECTION

PATENT NO. : 8,163,667 B2  Page 1 of 1
APPLICATION NO. : 12/488059
DATED : April 24, 2012
INVENTOR(S) : Wilfried Clauss It is certified that error appears in the above-identified patent and that said Letters Patent is hereby corrected as shown below:

Column 2, Line 5: delete "Ligh" and insert -- Light --

Column 2, Line 11: delete "Phsyical" and insert -- Physical --

Column 9, Lines 37-38: delete "example, from the oxidation state Fe3+ to the oxidation state Fe2+. Typically," and insert -- example, from the oxidation state Fe3+ to the oxidation state Fe2+. Typically, --

Column 12, Line 5: in Claim 19, delete "of of" and insert -- of --

Column 12, Line 15: in Claim 22, delete "the" and insert -- of the --

Column 12, Line 33: in Claim 25, delete "pm." and insert -- ppm. --

Signed and Sealed this
Eleventh Day of September, 2012

David J. Kappos
*Director of the United States Patent and Trademark Office*